United States Patent
Kotsubo et al.

(10) Patent No.: US 6,882,091 B2
(45) Date of Patent: Apr. 19, 2005

(54) ELECTROMAGNETIC-WAVE SHIELDING AND LIGHT TRANSMITTING PLATE AND MANUFACTURING METHOD THEREOF

(75) Inventors: Hidefumi Kotsubo, Kodaira (JP); Yasuhiro Morimura, Kodaira (JP); Itsuo Tanuma, Sayama (JP)

(73) Assignee: Bridgestone Corporation, Tokyo (JP)

( * ) Notice: Subject to any disclaimer, the term of this patent is extended or adjusted under 35 U.S.C. 154(b) by 0 days.

(21) Appl. No.: 10/849,008

(22) Filed: May 20, 2004

(65) Prior Publication Data

US 2004/0214503 A1 Oct. 28, 2004

Related U.S. Application Data

(63) Continuation of application No. PCT/JP02/11546, filed on Nov. 6, 2002.

(30) Foreign Application Priority Data

Nov. 20, 2001 (JP) .................................. 2001-354896

(51) Int. Cl.[7] .................................................. H01J 5/16
(52) U.S. Cl. ........................ 313/112; 313/461; 313/473
(58) Field of Search ................................ 313/461, 466, 313/473, 110, 112

(56) References Cited

FOREIGN PATENT DOCUMENTS

| JP | 10-161550 A | 6/1998 |
|---|---|---|
| JP | 2000-59080 A | 2/2000 |
| JP | 2000-196285 A | 7/2000 |
| JP | 2000-282286 A | 10/2000 |

*Primary Examiner*—Vip Patel
(74) *Attorney, Agent, or Firm*—Sughrue Mion, PLLC

(57) ABSTRACT

To manufacture an electromagnetic-wave shielding and light transmitting plate having a conductive pattern of which line width is narrow and open area ratio is high, a resin pattern 2 is printed on a transparent film 1 having a low affinity for a plated layer by using a resin having a high affinity for the plated layer. Then, a conductive material layer is formed by electroless plating on the resin pattern 2 of the film 1, thereby forming the conductive pattern 3. After that, the blackening treatment is conducted, thereby obtaining the electromagnetic-wave shielding and light transmitting plate.

12 Claims, 1 Drawing Sheet

ELECTROMAGNETIC-WAVE SHIELDING AND LIGHT TRANSMITTING PLATE AND MANUFACTURING METHOD THEREOF

CROSS REFERENCE TO RELATED APPLICATION

This is a continuation application of PCT/JP02/11546 filed on Nov. 6, 2002.

FIELD OF THE INVENTION

The present invention relates to an electromagnetic-wave shielding and light transmitting plate which can be suitably used as a front filter for a PDP (plasma display panel) or a window sheet (for example, a bonding film) for a building such as a hospital where needs electromagnetic-wave shielding and to a manufacturing method of the same. More particularly, the present invention relates to an electromagnetic-wave shielding and light transmitting plate which comprises a film and a conductive pattern formed on the film and to a manufacturing method of the same.

BACKGROUND OF THE INVENTION

Plates having electromagnetic-wave shielding property and light transmission properties have been developed as front filters of equipment such as office automation equipment and communication equipment in order to shield electromagnetic wave produced from such equipment. Such plates have been also utilized as window sheets of places where a precision apparatus is installed, such as a hospital and a laboratory, in order to protect the precision apparatus from electromagnetic waves for example from cellular phones.

A conventional electromagnetic-wave shielding and light transmitting plate typically comprises a pair of transparent substrates such as acrylic boards and a conductive mesh member like a wire netting or a transparent conductive film and is formed by interposing the conductive mesh member or the transparent conductive film between the transparent substrates and uniting them.

A conductive mesh member employed in the conventional electromagnetic-wave shielding and light transmitting plate is a 5- to 500-mesh member having a wire diameter of from 10 to 500 μm and an open area ratio (open area percentage) of less than 75%. The open area ratio is calculated from the wire diameter of mesh and the number of wires existing within a width of 1 inch. The electromagnetic-wave shielding and light transmitting plate employing such a conductive mesh member has low light transmittance of 70% at the most.

Moreover, such a conventional conductive mesh member easily allows the occurrence of moiré phenomenon due to relations between its patterns and the pixel pitch of a luminescent panel to which the electromagnetic-wave shielding and light transmitting plate is attached.

As means for satisfying the light transmitting property and the electromagnetic-wave shielding property simultaneously, it is considered to use a transparent conductive film instead of the conductive mesh member. In case of the transparent conductive film, however, it is difficult to achieve electric conduction relative to a panel body.

In case of the conductive-mesh member, by designing the conductive mesh member to have margins out of the peripheries of the transparent substrate and folding the margins, the electric conduction between the folded margins and the panel body is achieved. If the transparent conductive film is designed to have margins out of the transparent substrate and the margins are folded, the film may be torn at the folded portions.

SUMMARY OF THE INVENTION

It is an object of the present invention to provide an electromagnetic-wave shielding and light transmitting plate having a conductive pattern of which line width is sufficiently narrow and open area ratio is significantly high and to provide a manufacturing method of the same.

A method of manufacturing an electromagnetic-wave shielding and light transmitting plate according to the present invention is a method for manufacturing an electromagnetic-wave shielding and light transmitting plate comprising a transparent film and a conductive pattern made of a conductive material, wherein the conductive pattern is formed on a surface of the transparent film by plating. The method comprises: a step of forming a resin pattern to be the same pattern as the conductive pattern, wherein the resin pattern is formed on the surface of the transparent film having a relatively low affinity for the plated layer by using a resin having a relatively high affinity for the plated layer, and a step of forming the conductive pattern by subjecting the transparent film to plating treatment with plating solution after the formation of the resin pattern so as to attach the conductive material only to the resin pattern.

An electromagnetic-wave shielding and light transmitting plate of the present invention comprises a transparent film having a relatively low affinity for a plated layer, a resin pattern formed on a surface of the transparent film and having a relatively high affinity for the plated layer, and a conductive pattern composed of the plated layer of a conductive material which is formed on the resin pattern.

In the electromagnetic-wave shielding and light transmitting plate and the manufacturing method thereof, a fine and exquisite pattern can be formed because the resin for forming the resin pattern has low viscosity. The conductive pattern formed on the resin pattern has a significantly narrow line width and thus has a significantly large open area ratio.

According to the present invention, for example, an electromagnetic-wave shielding and light transmitting plate having a conductive pattern of which line width is 200 μm or less and open area ratio is 75% or more can be manufactured.

DETAILED DESCRIPTION

Figure 1:
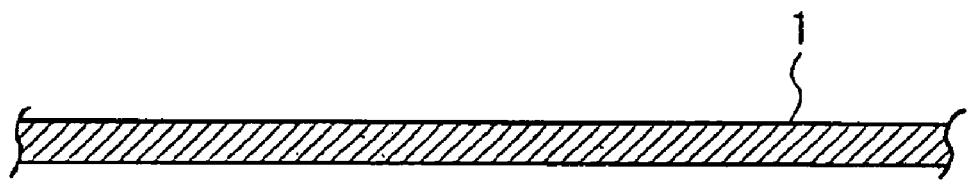
FIGS. 1, 2, and 3 are sectional views showing an embodiment of the method according to the present invention.
Figure 2:
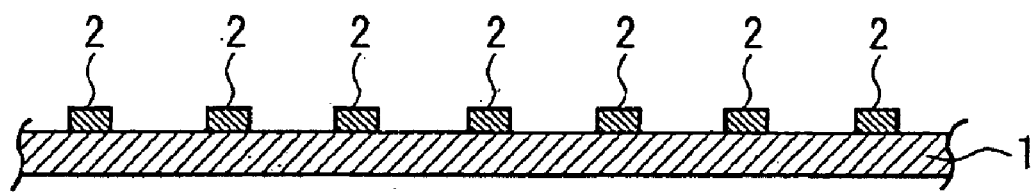
Figure 3:
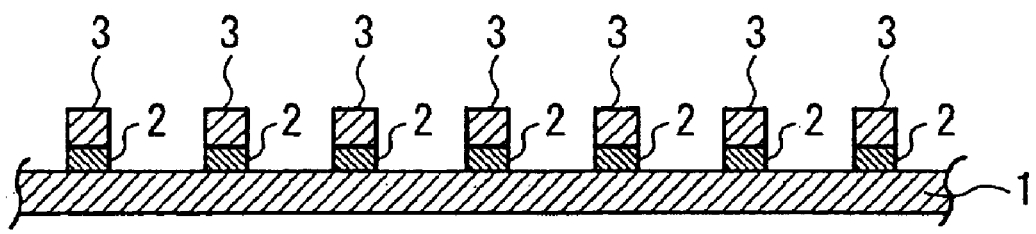

In an embodiment of the present invention shown in FIGS. 1 and 2, a resin pattern 2 is printed in a grid configuration by using a resin material having a relatively high affinity for a plated layer of a conductive material on a transparent film 1 having a relatively low affinity for the plated layer. Then, the transparent film 1 is subjected to plating treatment so as to form a conductive pattern 3 as a plated layer of a conductive material only on the resin pattern 2 as shown in FIG. 3.

Since the conductive pattern 3 is formed on the resin pattern 2 in the grid configuration, the conductive pattern 3 has the same grid configuration as that of the resin pattern 2. By setting the line width of the resin pattern 2 narrower, the conductive pattern 3 having a grid configuration of a narrower line width is obtained. By setting the line width of the resin pattern 2 having a grid configuration to be narrower and designing the resin pattern 2 to have larger open area, the conductive pattern 3 having a grid configuration of a larger open area ratio is obtained.

Hereinafter, preferred examples of the aforementioned respective materials will be described.

As the material of the transparent film 1, a transparent synthetic resin having a low affinity for the plated layer of the conductive material is employed. Examples of the synthetic resin include PC (polycarbonate), cycloolefin polymer, polyallylate, and acrylic polymer.

As the transparent film, a transparent film made of material having a low affinity for the plated layer as its chemical property is preferably used and a transparent film of which surface is not etched and affinity for the plated layer never be intensified even when it is in contact with plating solution is more preferably used.

The thickness of the transparent film depends on the application of the electromagnetic-wave shielding and light transmitting plate and usually is in a range of from 1 $\mu$m to 5 mm.

The resin pattern 2 on the film 1 is preferably formed by printing. Suitably used as the printing material are materials commercially-designated as photoresist. Among such materials, solution of ABS, triacetylcellulose, polyacetal, or modified PPO (polyphenylene oxide) is suitable. When the pattern is printed with such a photoresist, the printed photoresist is hardened by irradiation of energy beam such as ultraviolet ray and is then subjected to plating treatment.

The resin pattern 2 is printed to be a grid configuration. The line width of this pattern is preferably 200 $\mu$m or less, more preferably 100 $\mu$m or less, especially preferably 30 $\mu$m or less. As the printing method, gravure printing, screen printing, ink jet printing, or electrostatic printing can be suitably employed. In order to minimize the line width, the gravure printing is suitable.

The printing thickness of the resin pattern is not particularly limited and usually is in a range of from 0.1 $\mu$m to 10 $\mu$m.

Examples suitably used as the conductive material forming the conductive pattern 3 are metals of aluminum, nickel, indium, chromium, gold, vanadium, tin, cadmium, silver, platinum, copper, titanium, cobalt, and zinc and alloys thereof. Among these, pure metals of copper, nickel, chromium, zinc, tin, silver, and gold and alloys thereof are preferable.

The thickness of the conductive pattern 3 is preferably from 0.1 $\mu$m to 10 $\mu$m. When the thickness is less than 0.1 $\mu$m, the electromagnetic-wave shielding property must be insufficient. When the thickness of the pattern 3 is larger than 10 $\mu$m, the view angle of the electromagnetic-wave shilding and light transmitting plate may be narrow and the plating may spread in the width direction so as to increase the line width, thus reducing the open area ratio.

As the method of forming the conductive pattern 3 as the plated layer, electroless plating is preferable.

Before the electroless plating, the resin pattern 2 may be subjected to pretreatment with acid. The pretreatment with acid increases the affinity for the plated layer of the resin pattern 2. Examples of the acid include chromic acid, sulfuric acid, and blend thereof.

After the formation of the conductive pattern 3, blackening treatment may be applied in order to impart antidazzle property. As the blackening method, oxidation treatment of metal or black plating treatment with chromium alloy may be employed.

The electromagnetic-wave shielding and light transmitting plate manufactured as mentioned above may be a piece of film or a continuous web-like film which is accommodated in a roll form.

EXAMPLES

Hereinafter, an example will be described. The example is just an illustrative example of the present invention and the present invention is not limited by the example.

Example 1

A grid was printed on a polycarbonate film of 100 $\mu$m in thickness by using 20% solution in which ABS resin (3001M available from Mitsubishi Rayon Co., Ltd.) was dissolved in methyl ethyl ketone. The ABS resin pattern was regularly aligned in a square grid configuration so that the line width of the grid was 20 $\mu$m, one side of each aperture of the grid was 250 $\mu$m, and the open area ratio was 80%. The printing thickness after dried is 2 $\mu$m.

Copper was plated on the grid of ABS resin pattern by means of the electroless plating in such a manner as to have an average thickness of 2 $\mu$m. Finally, blackening treatment was applied by means of oxidation treatment, thereby obtaining an electromagnetic-wave shielding and light transmitting plate. It should be noted that the copper is not attached to the surface of the polycarbonate film at all.

The conductive pattern on the surface of the film was regularly aligned in a square grid configuration so that the line width was 20 $\mu$m, one side of each aperture of the grid was 250 $\mu$m, and the open area ratio was 80% just like the abs resin pattern.

As mentioned above, an electromagnetic-wave shielding and light transmitting plate having a conductive pattern of which line width is narrow and open area ratio is high can be manufactured.

What is claimed is:

1. An electromagnetic-wave shielding and light transmitting plate comprising a transparent film having a relatively low affinity for a plated layer, a resin pattern formed on a surface of the transparent film and having a relatively high affinity for the plated layer, and a conductive pattern composed of the plated layer of a conductive material which is formed on said resin pattern.

2. An electromagnetic-wave shielding and light transmitting plate as claimed in claim 1, wherein the line width of said conductive pattern is 200 $\mu$m or less and the open area ratio is 75% or more.

3. An electromagnetic-wave shielding and light transmitting plate as claimed in claim 2, wherein electromagnetic-wave shielding and light transmitting plate is manufactured by the method comprising:

a step of forming a resin pattern to be the same pattern as said conductive pattern, wherein the resin pattern is formed on the surface of the transparent film having a relatively low affinity for the plated layer by using a resin having a relatively high affinity for the plated layer, and a step of forming said conductive pattern by subjecting the transparent film to plating treatment with plating solution after the formation of the resin pattern so as to attach the conductive material only to the resin pattern.

4. An electromagnetic-wave shielding and light transmitting plate as claimed in claim 1, wherein electromagnetic-wave shielding and light transmitting plate is manufactured by the method comprising:

a step of forming a resin pattern to be the same pattern as said conductive pattern, wherein the resin pattern is formed on the surface of the transparent film having a relatively low affinity for the plated layer by using a resin having a relatively high affinity for the plated layer, and a step of forming said conductive pattern by subjecting the transparent film to plating treatment with plating solution after the formation of the resin pattern so as to attach the conductive material only to the resin pattern.

5. A method of manufacturing an electromagnetic-wave shielding and light transmitting plate comprising a transparent film and a conductive pattern made of a conductive material, wherein the conductive pattern is formed on a surface of the transparent film by plating, the method comprising:

a step of forming a resin pattern to be the same pattern as said conductive pattern, wherein the resin pattern is formed on the surface of the transparent film having a relatively low affinity for the plated layer by using a resin having a relatively high affinity for the plated layer, and a step of forming said conductive pattern by subjecting the transparent film to plating treatment with plating solution after the formation of the resin pattern so as to attach the conductive material only to the resin pattern.

6. A method of manufacturing an electromagnetic-wave shielding and light transmitting plate as claimed in claim 5, wherein said resin pattern is formed in a grid configuration.

7. A method of manufacturing an electromagnetic-wave shielding and light transmitting plate as claimed in claim 5, wherein said resin pattern is formed by printing.

8. A method of manufacturing an electromagnetic-wave shielding and light transmitting plate as claimed in claim 5, wherein after said conductive pattern is formed, said conductive pattern is subjected to blackening treatment.

9. A method of manufacturing an electromagnetic-wave shielding and light transmitting plate as claimed in claim 5, wherein said transparent film is made of one or more selected from a group consisting of PC, cycloolefin polymer, polyallylate, and acrylic polymer.

10. A method of manufacturing an electromagnetic-wave shielding and light transmitting plate as claimed in claim 5, wherein said resin is one or more selected from a group consisting of ABS, triacetylcellulose, polyacetal, and modified PPO.

11. A method of manufacturing an electromagnetic-wave shielding and light transmitting plate as claimed in claim 5, wherein said conductive material contains at least one of a group consisting of copper, nickel, chromium, zinc, tin, silver, and gold.

12. A method of manufacturing an electromagnetic-wave shielding and light transmitting plate as claimed in claim 6, wherein said resin pattern is formed by printing.

* * * * *